(12) United States Patent
Goto et al.

(10) Patent No.: US 12,438,517 B2
(45) Date of Patent: Oct. 7, 2025

(54) QUARTZ VIBRATION ELEMENT AND MANUFACTURING METHOD OF QUARTZ VIBRATION ELEMENT

(71) Applicant: Murata Manufacturing Co., Ltd., Nagaokakyo (JP)

(72) Inventors: Taiki Goto, Nagaokakyo (JP); Hiroshi Kumano, Nagaokakyo (JP); Kaiza Makino, Nagaokakyo (JP); Takashi Hase, Nagaokakyo (JP); Mitsuhiro Yamada, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 18/816,495

(22) Filed: Aug. 27, 2024

(65) Prior Publication Data
US 2024/0421797 A1 Dec. 19, 2024

Related U.S. Application Data

(63) Continuation of application No. PCT/JP2022/041362, filed on Nov. 7, 2022.

(30) Foreign Application Priority Data

Mar. 22, 2022 (JP) ................. 2022-045837

(51) Int. Cl.
*H03H 9/19* (2006.01)
*H03H 3/02* (2006.01)
*H03H 9/10* (2006.01)

(52) U.S. Cl.
CPC ................ *H03H 9/19* (2013.01); *H03H 3/02* (2013.01); *H03H 9/10* (2013.01)

(58) Field of Classification Search
CPC ........ H03H 9/19; H03H 9/10; H03H 9/02023; H03H 9/02157; H03H 9/1021; H03H 3/02

See application file for complete search history.

(56) References Cited

U.S. PATENT DOCUMENTS

| | | | |
|---|---|---|---|
| 4,542,355 A | * | 9/1985 | Ballato .................... H03H 9/56 333/191 |
| 10,425,059 B2 | | 9/2019 | Obara et al. |

(Continued)

FOREIGN PATENT DOCUMENTS

| | | |
|---|---|---|
| JP | 2003-324332 A | 11/2003 |
| JP | 2016-096583 A | 5/2016 |

(Continued)

OTHER PUBLICATIONS

International Search Report received for PCT Patent Application No. PCT/JP2022/041362, mailed on Jan. 31, 2023, 2 pages (English Translation Only).

*Primary Examiner* — Jeffrey M Shin
(74) *Attorney, Agent, or Firm* — ArentFox Schiff LLP

(57) ABSTRACT

A quartz vibration element that includes: a quartz plate having first and second principal surfaces; first and second driving electrodes on the first and second principal surfaces, respectively, wherein when an X-axis, a Y-axis, and a Z-axis are defined as crystallographic axes of a quartz crystal of the quartz plate, an X'-axis and a Y'-axis are obtained by rotating the X-axis and the Y-axis about the Z-axis by a rotation angle $\varphi$, and a Y"-axis and a Z'-axis are obtained by rotating the Y'-axis and the Z-axis about the X'-axis by a rotation angle $\theta$, the first and second principal surfaces are perpendicular to the Y"-axis, and when one of the first or second principal surfaces is viewed in plan and an angle $\psi$ is between the X-axis and a long side of the quartz plate, the quartz plate (Continued)

satisfies both $\Psi = \alpha \times \varphi \times \theta$ and $-0.0165-0.016 \leq \alpha \leq -0.0165+0.016$ or $+0.0165-0.016 \leq \alpha \leq +0.0165+0.016$.

18 Claims, 8 Drawing Sheets

(56) References Cited

U.S. PATENT DOCUMENTS

2017/0302249 A1   10/2017  Obara et al.
2022/0345104 A1* 10/2022  Salt ..................... H03H 9/0519

FOREIGN PATENT DOCUMENTS

| | | |
|---|---|---|
| JP | 2017-192032 A | 10/2017 |
| JP | 2021-078062 A | 5/2021 |

* cited by examiner

QUARTZ VIBRATION ELEMENT AND MANUFACTURING METHOD OF QUARTZ VIBRATION ELEMENT

CROSS REFERENCE TO RELATED APPLICATIONS

The present application is a continuation of International application No. PCT/JP2022/041362, filed Nov. 7, 2022, which claims priority to Japanese Patent Application No. 2022-045837, filed Mar. 22, 2022, the entire contents of each of which are incorporated herein by reference.

TECHNICAL FIELD

The present disclosure relates to a quartz vibration element and a method of manufacturing the quartz vibration element.

BACKGROUND

Quartz vibration elements are applied, for example, to timing devices, sensors, or oscillators in various electronic devices used in mobile communication terminals, communication base stations, home appliances, etc. A quartz vibration element includes a quartz plate having a pair of principal surfaces and a pair of driving electrodes formed on respective principal surfaces.

For example, Patent Document 1 discloses a quartz vibration element equipped with a doubly rotated quartz plate having a tetragonal surface as viewed in plan. The tetragonal surface of the quartz plate is obtained by rotating the surface of a quartz crystal perpendicular to a Y-axis about a Z-axis by a rotation angle $\varphi$ and subsequently by rotating the surface of the quartz crystal about an X-axis by a rotation angle $\theta$. The tetragonal surface has a side parallel to an X'-axis and a side parallel to a Z'-axis.

Patent Document 2 discloses a quartz vibration element equipped with a quartz plate having a pair of principal surfaces extending parallel to the X'-axis and the Z'-axis. The X'-axis is obtained by rotating an X-axis about a Z-axis by 15 to 25 degrees, in which the X-axis and the Z-axis are crystallographic axes of a quartz crystal, and the Z'-axis is subsequently obtained by rotating the Z-axis about the X'-axis by 33 to 34 degrees.

Patent Document 1: Japanese Unexamined Patent Application Publication No. 2021-78062
Patent Document 2: Japanese Unexamined Patent Application Publication No. 2017-192032

SUMMARY OF THE DISCLOSURE

In the quartz vibration element of Patent Document 1, when the quartz crystal is rotated by the rotation angle $\theta$, the quartz crystal needs to be inclined to measure the angle, which may make the system complicated for angle measurement and crystal cutting. This may decrease the angular accuracy of the quartz plate obtained and may lead to an increase in secondary vibration and thereby an increase in the equivalent series resistance (ESR). As a result, the frequency shift by temperature increases within a predetermined range of temperature.

In the quartz vibration element of Patent Document 2, the angle between the X-axis and the X'-axis is large as the principal surface of the quartz plate is viewed in plan, which leads to an increase in secondary vibration. As a result, the secondary vibration is combined with the primary vibration and thereby deteriorates the ESR.

The present disclosure is made in such circumstances, and accordingly an object of the present disclosure is to provide a quartz vibration element that can reduce the ESR and the frequency shift by temperature and also to provide a simplified method of manufacturing the quartz vibration element.

According to an aspect of the present disclosure, a quartz vibration element includes: a quartz plate having a first principal surface and a second principal surface facing oppositely to each other; a first driving electrode on the first principal surface of the quartz plate; and a second driving electrode on the second principal surface of the quartz plate, wherein when an X-axis, a Y-axis, and a Z-axis are defined as crystallographic axes of a quartz crystal of the quartz plate, an X'-axis and a Y'-axis of the quartz crystal are obtained by rotating the X-axis and the Y-axis about the Z-axis by a rotation angle $\varphi$, and a Y"-axis and a Z'-axis of the quartz crystal are obtained by rotating the Y'-axis and the Z-axis about the X'-axis by a rotation angle $\theta$, the first principal surface and the second principal surface of the quartz plate are perpendicular to the Y"-axis, and when one of the first principal surface or the second principal surface of the quartz plate is viewed in plan and an angle $\psi$ is an angle between the X-axis and a long side of the quartz plate, the quartz plate satisfies both $\psi=\alpha\times\varphi\times\theta$ and $-0.0165-0.016\leq\alpha\leq-0.0165+0.016$ or $+0.0165-0.016\leq\alpha\leq+0.0165+0.016$.

According to another aspect of the present disclosure, a method of manufacturing a quartz vibration element includes: preparing a quartz crystal having an X-axis, a Y-axis, and a Z-axis as crystallographic axes thereof; determining an X'-axis and a Y'-axis of the quartz crystal by rotating the X-axis and the Y-axis about the Z-axis by a rotation angle $\varphi$; cutting the quartz crystal along a plane perpendicular to the X'-axis; determining a Y"-axis and a Z'-axis of the quartz crystal by rotating the Y'-axis and the Z-axis about the X'-axis by a rotation angle $\theta$; and cutting the quartz crystal along a plane perpendicular to the Y"-axis to obtain a quartz plate having a first principal surface and a second principal surface that are perpendicular to the Y"-axis and face opposite to each other, and when one of the first principal surface or the second principal surface of the quartz plate is viewed in plan and an angle $\psi$ is an angle between the X-axis and a long side of the quartz plate, the quartz plate satisfies both $\psi=\alpha\times\varphi\times\theta$ and $-0.0165-0.016\leq\alpha\leq-0.0165+0.016$ or $+0.0165-0.016\leq\alpha\leq+0.0165+0.016$.

The present disclosure can provide a quartz vibration element that can reduce the ESR and the frequency shift by temperature and also can provide a simplified method of manufacturing the quartz vibration element.

DESCRIPTION OF THE PREFERRED EMBODIMENT

Figure 1:
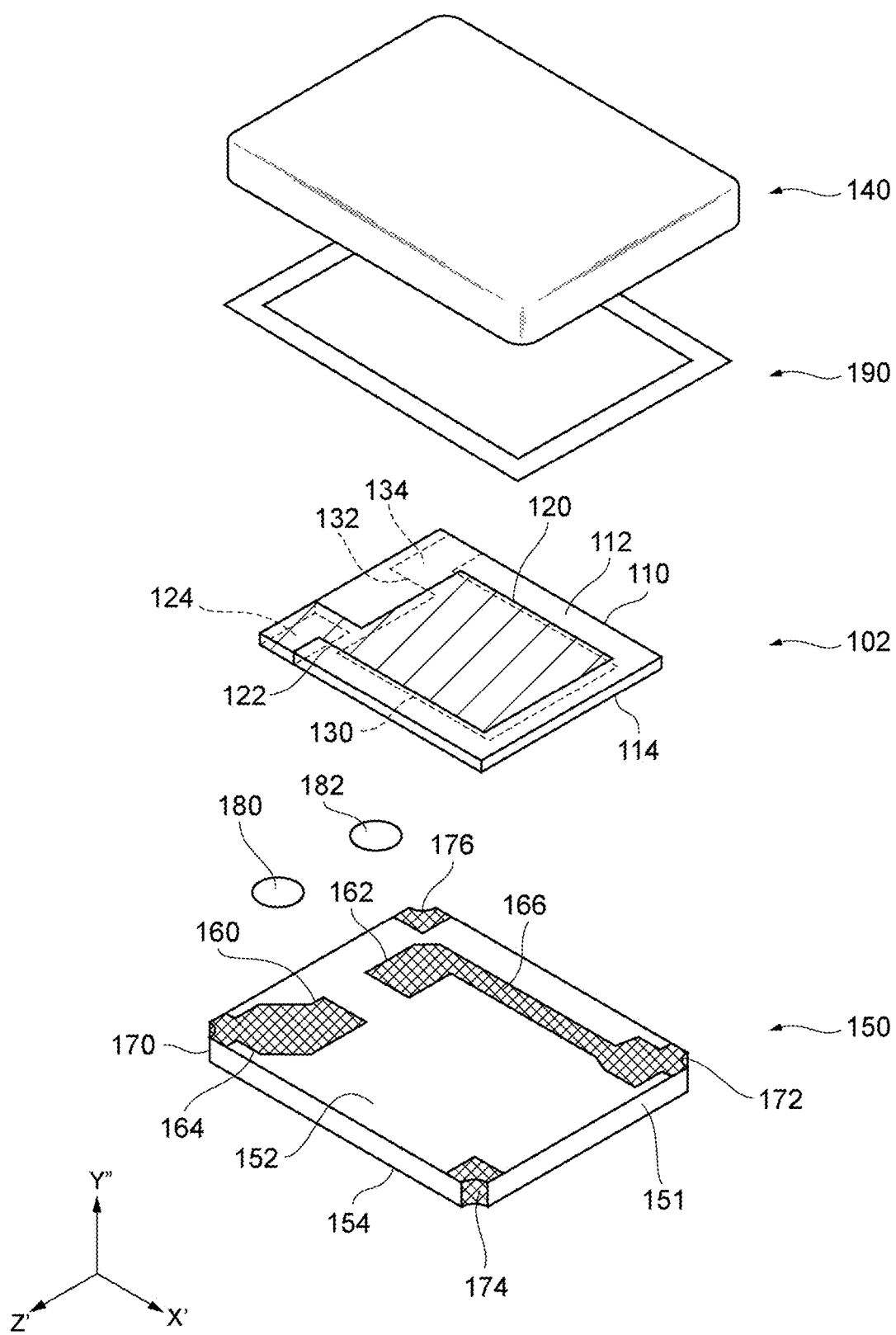
FIG. 1 is an exploded perspective view illustrating a quartz vibrator according to an embodiment of the present disclosure.

An embodiment of the present disclosure will be described. Note that the same or similar elements are denoted by the same or similar reference signs in the drawings. The drawings are examples, in which dimensions and shapes of elements are illustrated only schematically. The embodiment illustrated is not intended to limit the technical scope of the present disclosure.

<Quartz Vibrator>

Figure 2:
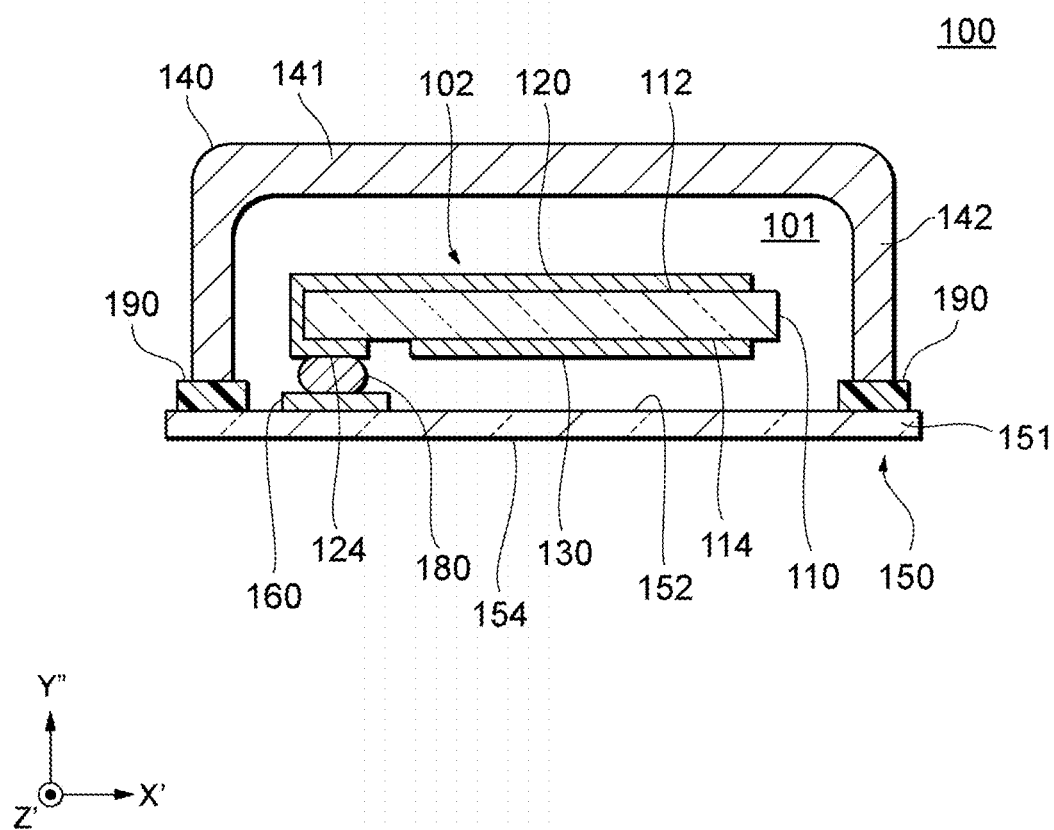
FIG. 2 is a cross-sectional view illustrating the quartz vibrator of FIG. 1.

A structure of a quartz vibrator 100 according to an embodiment of the present disclosure will be described with reference to FIGS. 1 and 2. FIG. 1 is an exploded perspective view illustrating the quartz vibrator according to the embodiment of the present disclosure. FIG. 2 is a cross-sectional view illustrating the quartz vibrator of FIG. 1.

The quartz vibrator 100 includes a quartz vibration element 102, a cover member 140, a base member 150, and a bonding member 190. The quartz vibration element 102 is disposed between the base member 150 and the cover member 140. The base member 150 and the cover member 140 form a container to accommodate the quartz vibration element 102. In the example illustrated in FIGS. 1 and 2, the base member 150 is shaped like a flat plate. The quartz vibration element 102 is accommodated in a cavity of the cover member 140. The shapes of the base member 150 and the cover member 140 are not limited to the above insofar as long as a driving part of the quartz vibration element 102 is accommodated in the container. For example, the base member 150 may have a cavity facing the cover member 140, or alternatively both of the base member 150 and the cover member 140 may have cavities that oppose each other.

The quartz vibration element 102 is an electro-mechanical energy conversion element that can convert electric energy into mechanical energy or vice versa using the piezoelectric effect. The quartz vibration element 102 includes a quartz plate 110 and a pair of driving electrodes, which are a first driving electrode 120 and a second driving electrode 130. The quartz vibration element 102 also includes a pair of extended electrodes, which are a first extended electrode 122 and a second extended electrode 132, and a pair of connection electrodes, which are a first connection electrode 124 and a second connection electrode 134.

The quartz plate 110 has an upper surface 112 and a lower surface 114 that face oppositely. The upper surface 112 faces a top wall 141 of the cover member 140, which will be described later. The top wall 141 is positioned opposite to the base member 150 with respect to the quartz plate 110. The lower surface 114 faces the base member 150. The upper surface 112 and the lower surface 114 are shaped rectangularly. The upper surface 112 and the lower surface 114 are principal surfaces of the quartz plate 110.

The quartz vibration element 102 utilizes the quartz plate 110 of which the dominant mode of vibration is the thickness-shear vibration mode. In the example illustrated in FIGS. 1 and 2, the upper surface 112 and the lower surface 114 of the quartz plate 110 are flat surfaces, but the surfaces do not need to be flat. The upper surface 112 and the lower surface 114 may be formed by etching so as to have a mesa or reverse-mesa shape or a convex or bevel shape.

The first driving electrode 120 and the second driving electrode 130 apply voltage to the quartz plate 110. The first driving electrode 120 is formed on the upper surface 112 of the quartz plate 110, and the second driving electrode 130 is formed on the lower surface 114 thereof. The first driving electrode 120 and the second driving electrode 130 oppose each other with the quartz plate 110 interposed therebetween. When the upper surface 112 of the quartz plate 110 is viewed in plan, the first driving electrode 120 and the second driving electrode 130 are shaped rectangularly and positioned so as to substantially overlap each other.

When the upper surface 112 of the quartz plate 110 is viewed in plan, the shapes of the first driving electrode 120 and the second driving electrode 130 do not need to be rectangles. The shapes of the first driving electrode 120 and the second driving electrode 130 as viewed in plan may be polygons, circles, or ovals or may be combinations of these.

The first extended electrode 122 electrically couples the first driving electrode 120 to the first connection electrode 124, and the second extended electrode 132 electrically couples the second driving electrode 130 to the second connection electrode 134. The first extended electrode 122 is formed on the quartz plate 110 from the upper surface 112 to the lower surface 114, and the second extended electrode 132 is formed on the lower surface 114 of the quartz plate 110.

The first connection electrode 124 and the second connection electrode 134 electrically couples the quartz vibration element 102 to the base member 150. The first connection electrode 124 and the second connection electrode 134 are formed on the lower surface 114 of the quartz plate 110 at opposite ends of one of the short sides of the lower surface 114.

The first driving electrode 120, the first extended electrode 122, and the first connection electrode 124 are formed integrally. Similarly, the second driving electrode 130, the second extended electrode 132, and the second connection electrode 134 are formed integrally. For example, each electrode of the quartz vibration element 102 has a multilayered structure having a base layer and a surface layer, which are laminated in this order. For example, the base layer is made of chromium (Cr) to provide good adhesion to the quartz plate 110, and the surface layer is made of gold (Au) to provide chemical stability.

The base member 150 holds the quartz vibration element 102 so as to enable the quartz vibration element 102 to vibrate. The base member 150 includes base plate 151, connection electrodes 160 and 162, extended electrodes 164 and 166, and outer electrodes 170, 172, 174, and 176, and electroconductive support members 180 and 182.

The base plate 151 is a tabular insulator having an upper surface 152 and a lower surface 154 that face oppositely in the thickness direction. The upper surface 152 and the lower surface 154 are a pair of principal surfaces of the base plate 151. The upper surface 152 is positioned so as to face the quartz vibration element 102 and the cover member 140. The upper surface 152 serves as a mounting surface on which the quartz vibration element 102 is mounted. The base plate 151 is preferably made of a heat-resistant material from the viewpoint of reducing the thermal stress of the quartz vibration element 102 due to the thermal hysteresis of the base plate 151 caused by reflowing, etc. From the same viewpoint, the base plate 151 may have a coefficient of thermal expansion close to that of the quartz plate 110. For example, the base plate 151 is a ceramic substrate, a glass substrate, or a quartz substrate.

The base plate 151 has corner portions, and each corner portion has a cut-away surface, which is a cylindrically curved surface (otherwise called a "castellation"). Note that the corner shape of the base plate 151 is not limited to this. The cut-away surface may be a flat surface. Alternatively, the corner may be a substantially right-angled corner without cutting.

The connection electrodes 160 and 162 are electrically coupled to the quartz vibration element 102. The connection electrode 160 is coupled to the connection electrode 124 of the quartz vibration element 102, and the connection electrode 162 is coupled to the connection electrode 134 of the quartz vibration element 102.

The extended electrode 164 electrically couples the connection electrode 160 to the outer electrode 170, and the extended electrode 166 electrically couples the connection electrode 162 to the outer electrode 172. The extended electrodes 164 and 166 are formed on the upper surface 152 of the base plate 151.

The outer electrodes 170 and 172 serve to electrically couple the quartz vibration element 102 to an outside circuit board. The outer electrode 170 electrically couples the first driving electrode 120 of the quartz vibration element 102 to the outside circuit board, and the outer electrode 172 electrically couples the second driving electrode 130 of the quartz vibration element 102 to the outside circuit board. For example, one of the outer electrodes 174 and 176 is a ground electrode for grounding the cover member 140 and the other is a dummy electrode that is not electrically coupled to the quartz vibration element 102. Each of the outer electrodes 170, 172, 174, and 176 is continuously formed from the lower surface 154 to a corresponding one of the cut-away surfaces of the four corner portion of the base plate 151. In the example illustrated in FIG. 1, the outer electrode 170 and the outer electrode 172 are positioned at diagonally opposite corners of the upper surface 152 of the base plate 151, and the outer electrode 174 and the outer electrode 176 are positioned at the other diagonally opposite corners of the upper surface 152. The outer electrodes 170, 172, 174, and 176 are not limited to what is described above. The outer electrodes 174 and 176 may be both ground electrodes or may be both dummy electrodes. The outer electrodes 174 and 176 may be omitted. The outer electrode 174 may be electrically coupled to one of the outer electrodes 170 and 172, and the outer electrode 176 may be electrically coupled to the other one of these.

The electroconductive support members 180 and 182 electrically couple the quartz vibration element 102 to the base member 150 and also mechanically support the quartz vibration element 102. The electroconductive support member 180 electrically couples the first connection electrode 124 of the quartz vibration element 102 to the connection electrode 160 of the base member 150. The electroconductive support member 182 electrically couples the second connection electrode 134 of the quartz vibration element 102 to the connection electrode 162 of the base member 150. The electroconductive support members 180 and 182 are solidified products of an electroconductive adhesive that contains, for example, a thermosetting resin or a photosetting resin.

For example, the main ingredient of the electroconductive support members 180 and 182 is a silicone resin. The electroconductive support members 180 and 182 contain electroconductive particles, such as particles of a metal like silver (Ag).

The main ingredient of the electroconductive support members 180 and 182 is not limited to the silicone resin but may be, for example, an epoxy resin or an acrylic resin. The electroconductive particles contained in the electroconductive support members 180 and 182 are not limited to silver particles but may be particles of another metal, electroconductive ceramic particles, or particles of an electroconductive organic material. The electroconductive support members 180 and 182 may contain an electroconductive polymer.

The cover member 140 includes a top wall 141 and side walls 142 that extend from respective edges of the top wall 141 toward the base member 150. The top wall 141 opposes the base member 150 with the quartz vibration element 102 interposed therebetween, and the side walls 142 surround the quartz vibration element 102 with a gap provided therebetween. The cover member 140 is made preferably of an electroconductive material and more preferably of an airtight metallic material. The electroconductive material provides the cover member 140 with an electromagnetic shield function to reduce the likelihood of electromagnetic waves entering an internal space 101 of the cover member 140. The material of the cover member 140 desirably has a coefficient of thermal expansion close to that of the base member 150 in order to reduce the generation of thermal stress. For example, the material of the cover member 140 is an Fe—Ni—Co based alloy having a coefficient of thermal expansion similar to that of glass or ceramic material in a wide range of normal temperature. The cover member 140 is electrically grounded to one of the outer electrodes 174 and 176 via a grounding member (not illustrated).

The bonding member 190 joins the cover member 140 to the base member 150 and seals the internal space 101 in which the quartz vibration element 102 is accommodated. The bonding member 190 is a frame-shaped member disposed along the peripheral edges of the base member 150. The bonding member 190 is sandwiched between the end portions of the side walls 142 of the cover member 140 and the upper surface 152 of the base member 150. The bonding member 190 is made of an insulating material. The bonding member 190 is made of an organic adhesive containing, for example, an epoxy-, vinyl-, acryl-, urethane-, or silicone-based resin. The material of the bonding member 190 is not limited to the organic adhesive but may be an inorganic adhesive, such as a silicon-based adhesive containing water glass or the like or a calcium-based adhesive containing cement or the like. The material of the bonding member 190 may be a low melting glass (for example, lead-boric acid-based glass or tin-phosphoric acid-based glass).

Figure 3:
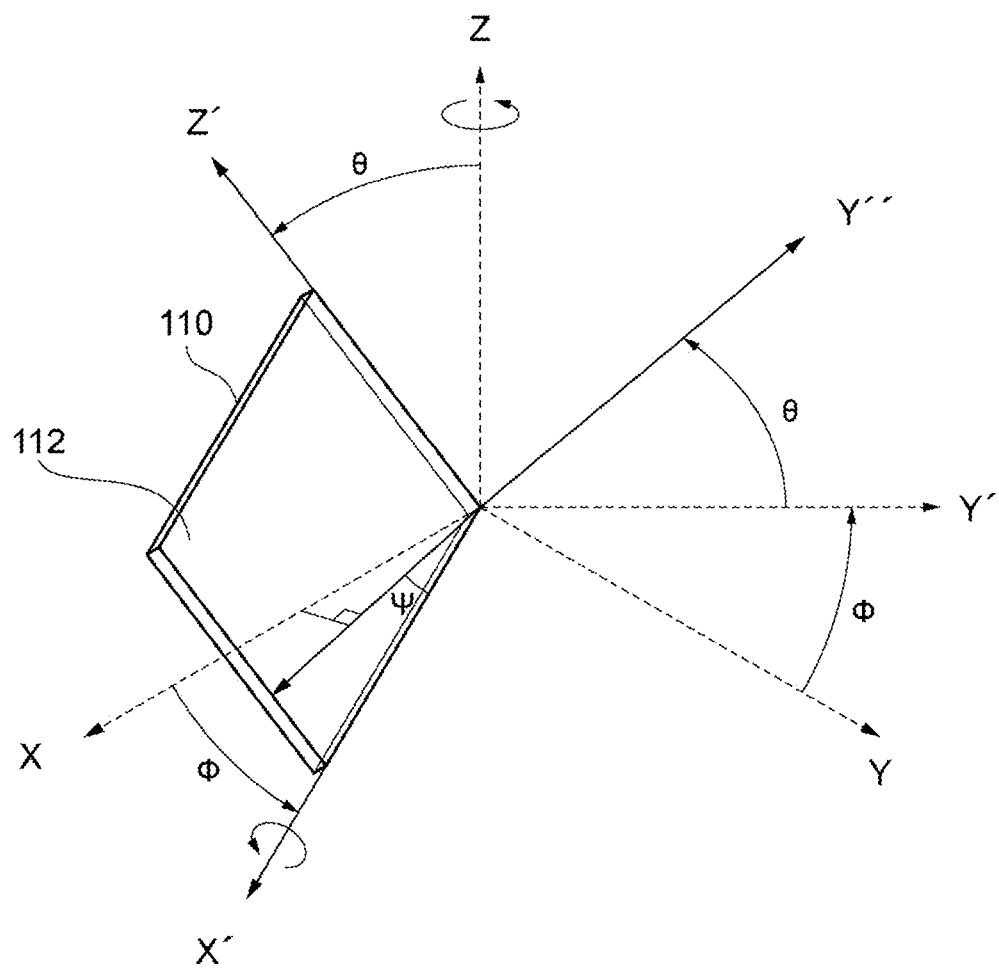
FIG. 3 is a view for explaining angles of a quartz plate illustrated in FIG. 1.
Figure 4:
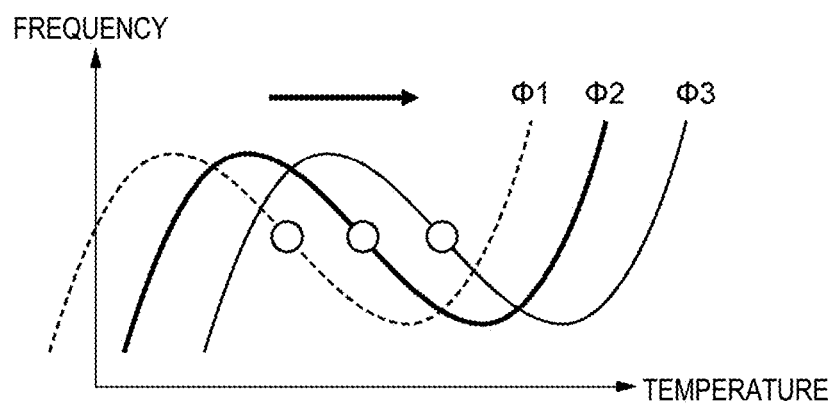
FIG. 4 is a graph for explaining a relationship between rotation angle $\varphi$ and frequency-temperature characteristics.
Figure 5:
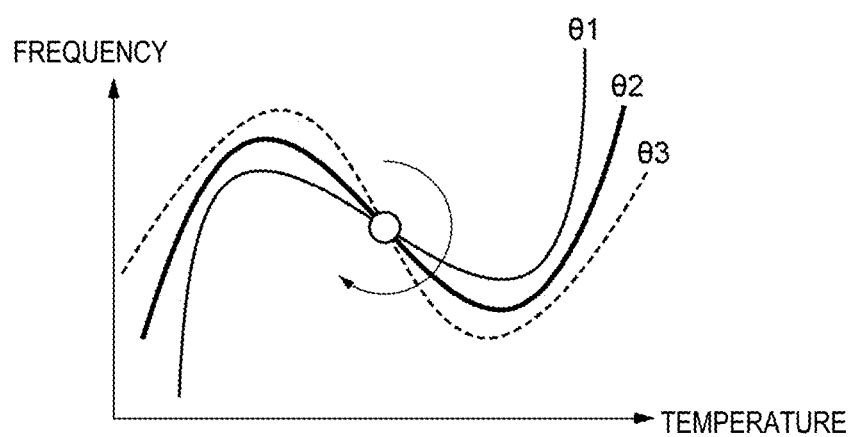
FIG. 5 is a graph for explaining a relationship between rotation angle $\theta$ and frequency-temperature characteristics.
Figure 6:
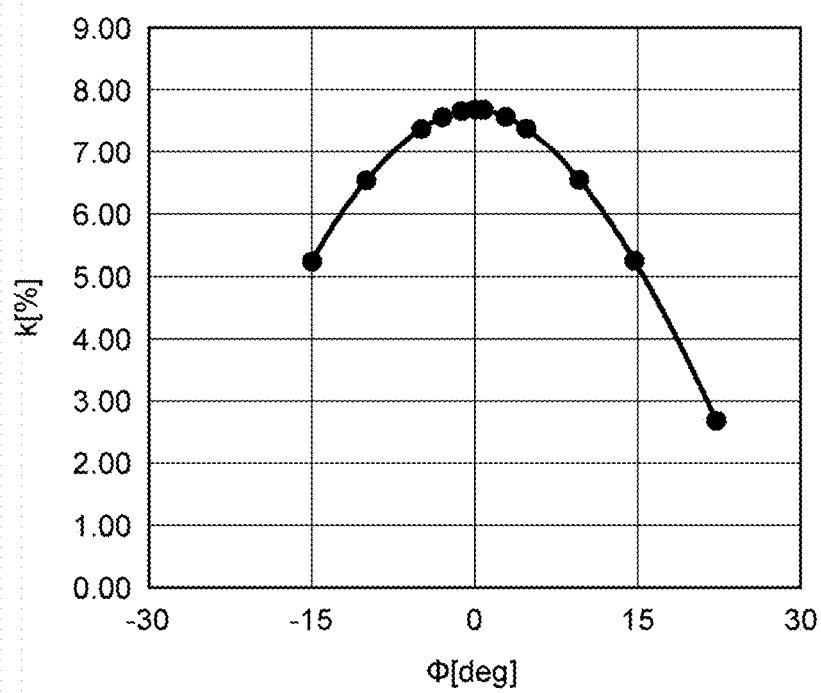
FIG. 6 is a graph for explaining a relationship between rotation angle φ and electromechanical coupling coefficient.

Next, the structure of the quartz plate 110 will be described in detail with reference to FIGS. 3 to 6. FIG. 3 is a view for explaining angles of the quartz plate of FIG. 1. FIG. 4 is a graph for explaining a relationship between rotation angle $\varphi$ and frequency-temperature characteristics. FIG. 5 is a graph for explaining a relationship between rotation angle $\theta$ and frequency-temperature characteristics. FIG. 6 is a graph for explaining a relationship between rotation angle $\varphi$ and electromechanical coupling coefficient.

The principal surfaces 112 and 114 of the quartz plate 110 are parallel to the Z'X' plane perpendicular to the Y"-axis. The quartz plate 110 is obtained by etching a quartz substrate (for example, a quartz wafer). The quartz substrate is obtained by cutting and polishing a synthetic quartz crystal.

As illustrated in FIG. 3, the upper surface 112 of the quartz plate 110 is shaped like a rectangle with long sides extending parallel to the X'-axis and short sides extending parallel to the Z'-axis. The quartz plate 110 is a tabular plate having a thickness in the direction parallel to the Y"-axis. The X'-axis, Y"-axis, and Z' axis are determined with respect to the crystallographic axes of the quartz crystal. More specifically, the quartz crystal has the X-axis, Y-axis, and Z-axis as the crystallographic axes, and the X'-axis and the Y'-axis are obtained by rotating the X-axis and the Y-axis about the Z-axis by a rotation angle $\varphi$. The Y"-axis and the Z'-axis are obtained by rotating the Y'-axis and the Z-axis about the X'-axis by a rotation angle $\theta$. Note that the quartz crystal has the electric axis (polar axis), the mechanical axis, and the optical axis, and the electric axis corresponds to the X-axis, the mechanical axis corresponds to the Y-axis, and the optical axis corresponds to the Z-axis.

When the upper surface 112 of the quartz plate 110 is viewed in plan and the angle $\psi$ is an angle between the X-axis and a long side of the quartz plate, the quartz plate 110 satisfies the following equations: $\psi=\alpha\times\varphi\times\theta$ and $-0.0165-0.016 \leq \alpha \leq -0.0165+0.016$ or $+0.0165-0.016 \leq \alpha \leq +0.0165+0.016$. Using the quartz plate 110 having the above angle properties provides the quartz vibration element 102 with favorable frequency-temperature characteristics and enables the quartz vibration element 102 to suppress the generation of secondary vibrations. Note that the angle $\psi$ can be otherwise defined as an angle between the X'-axis and a projected axis of the X-axis on the upper surface 112 when the X-axis is projected on the upper surface 112 in the direction along the Y" axis.

When the rotation angle $\varphi$ for counterclockwise rotation as viewed from the positive side along the Z-axis is assumed to be positive, the quartz plate 110 satisfies $1° \leq \varphi \leq 14°$. As illustrated in FIG. 4, changing the rotation angle $\varphi$ shifts the frequency-temperature curve toward the high-temperature side or the low-temperature side. In the case of $1° \leq \varphi \leq 14°$, the frequency-temperature curve shifts toward the high-temperature side relative to the case of $\varphi=0$. This reduces the change of frequency in a high-temperature zone. In addition, as illustrated in FIG. 6, changing the rotation angle $\varphi$ causes the electromechanical coupling coefficient k to decrease from the peak value at $\varphi=0$, which results in an increase in secondary vibration. Satisfying the formula $1° \leq \varphi \leq 14°$ reduces the decrease of the electromechanical coupling coefficient k and reduces the generation of secondary vibration, which can keep the equivalent series resistance (ESR) lower.

When the rotation angle $\theta$ for counterclockwise rotation as viewed from the positive side along the X'-axis is assumed to be positive, the quartz plate 110 desirably satisfies $30° \leq \theta \leq 40°$. As illustrated in FIG. 5, changing the rotation angle $\theta$ causes the frequency-temperature curve to rotate about the point of inflection. In the case of $30° \leq \theta \leq 40°$, the frequency-temperature curve rotates clockwise compared with the case of $\theta=0$. This reduces the change of frequency in low- and high-temperature zones. The operating temperature of the quartz vibration element 102 can be expanded upward by satisfying both $1° \leq \varphi \leq 14°$ and $30° \leq \theta \leq 40°$.

Manufacturing Method

Figure 7:
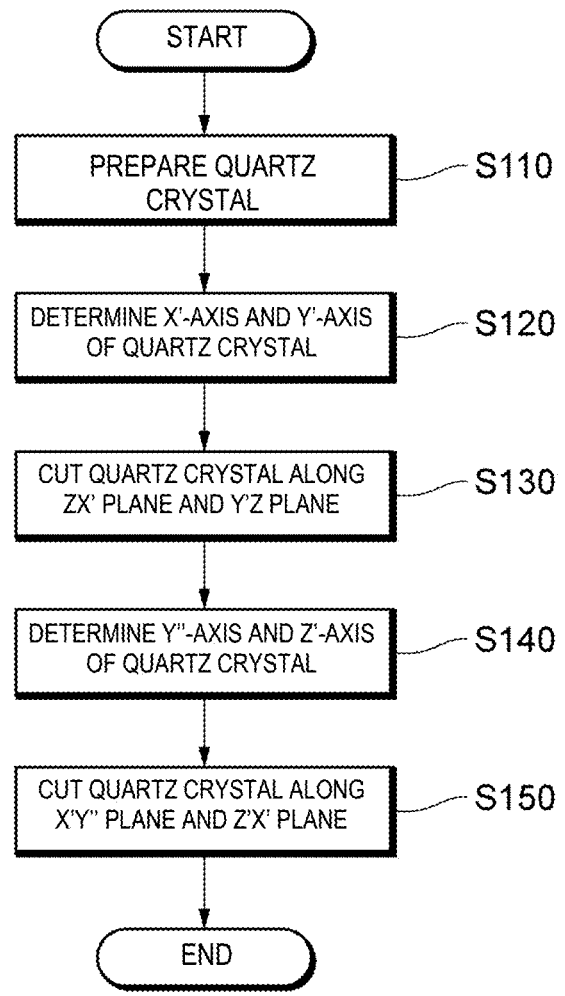
FIG. 7 is a flowchart illustrating part of a method of manufacturing a quartz vibration element according to the embodiment of the present disclosure.
Figure 8:
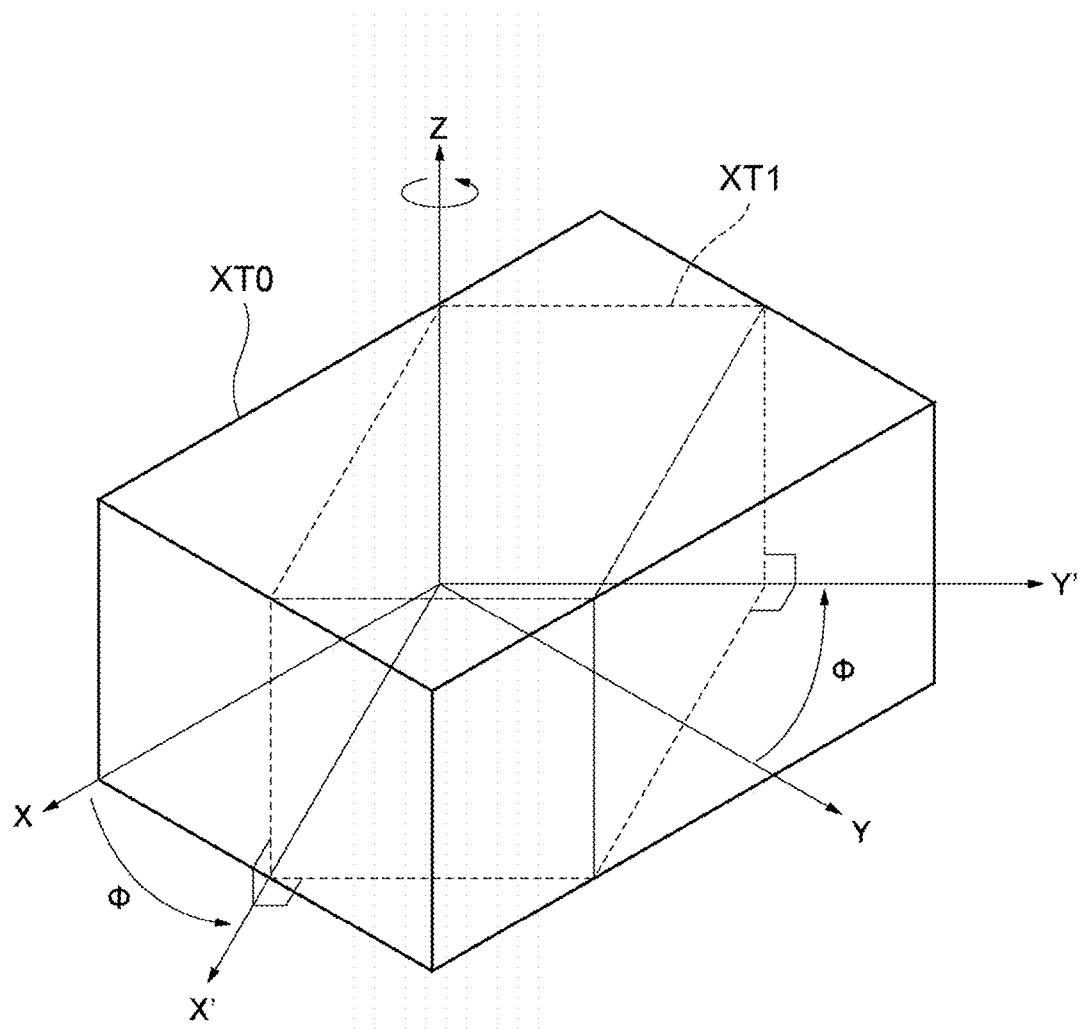
FIG. 8 is a view for explaining the method of manufacturing the quartz vibration element according to the embodiment of the present disclosure.
Figure 9:
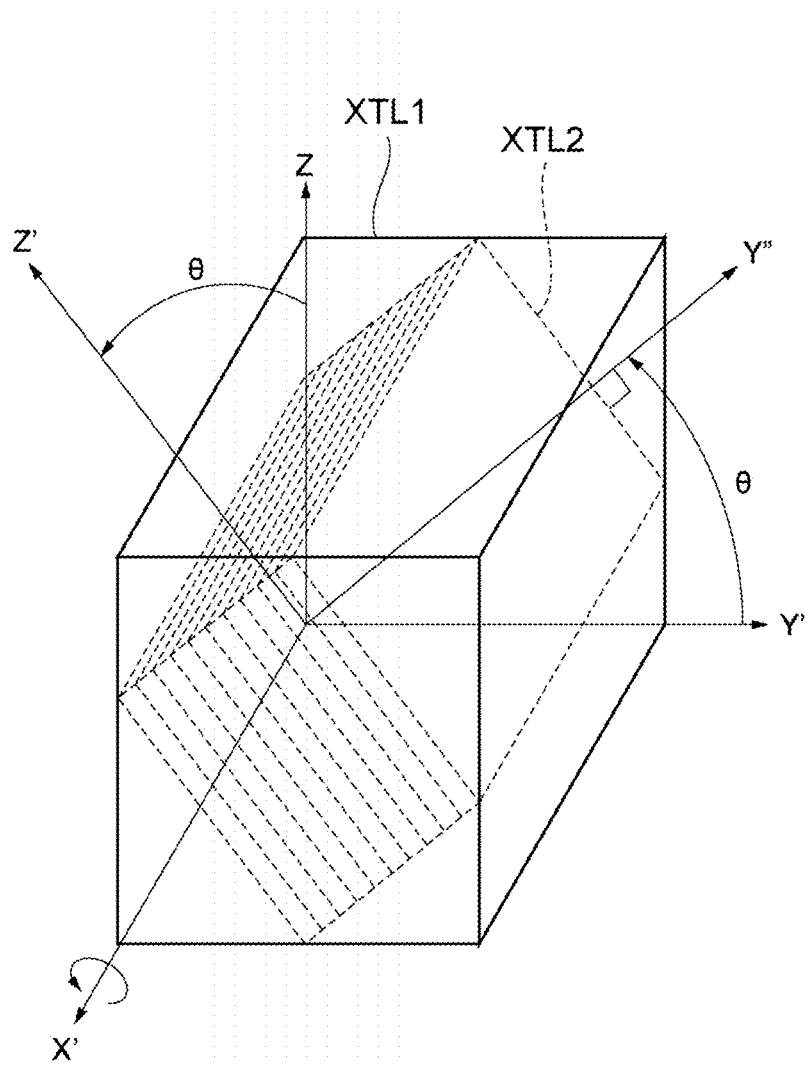
FIG. 9 is another view for explaining the method of manufacturing the quartz vibration element according to the embodiment of the present disclosure.

A method of manufacturing the quartz vibration element 102 according to the embodiment of the present disclosure will be described with reference to FIGS. 7 to 9. FIG. 7 is a flowchart illustrating part of the method of manufacturing the quartz vibration element according to the embodiment of the present disclosure. FIGS. 8 and 9 are views for explaining the method of manufacturing the quartz vibration element according to the embodiment of the present disclosure.

In step S110, a quartz crystal XT0 is prepared. The quartz crystal XT0 is a quartz crystal cut along the XY plane perpendicular to the Z-axis.

In step S120, the X'-axis and Y'-axis of the quartz crystal XT0 are determined. Subsequently, in step S130, the quartz crystal XT0 is cut along the ZX' plane and the Y'Z plane. More specifically, the quartz crystal XT0 is mounted on a rotating stage in such a manner that one of the surfaces along the XY plane is in contact with the mounting surface of the rotating stage and the other surface along the XY plane faces upward. While the crystal orientation of the quartz crystal XT0 is being measured on the above-described other surface along the XY plane using an X-ray orientation measurement system, the rotating stage is rotated in in-plane directions of the mounting surface. The X'-axis and the Y'-axis of the quartz crystal XT0 are thus determined. Next, the quartz crystal XT0 on the rotating stage is cut along the X'-axis and the Y'-axis using a crystal cutter oriented perpendicular to the mounting surface of the rotating stage. A quartz crystal XT1 is thereby cut out from the quartz crystal XT0 as illustrated in FIG. 8. Note that in step S130, it is sufficient to cut the quartz crystal XT0 only along the Y'Z plane, which serves as a measurement surface for the X-ray orientation measurement system later in step S140, and it is not necessary to cut the quartz crystal XT0 along the ZX' plane. For details of the orientation measurement and the cutting of the quartz crystal, see "Making Doubly Rotated Quartz Plates" by W. L. Bond and J. A. Kusters, published in 31st Annual Symposium on Frequency Control (Jun. 1 to 3, 1977) and added to IEEE Xplore (Dec. 5, 2005). In the present embodiment, the rotation angles are measured in accordance with the method described in this paper.

Next, in step S140, the Y"-axis and the Z'-axis of the quartz crystal XT1 are determined. Subsequently, in step S150, the quartz crystal XT1 is cut along the X'Y" plane and the Z'X' plane. More specifically, the Y"-axis and Z'-axis of the quartz crystal XT1 are determined using the X-ray orientation measurement system on the measurement surface along the Y'Z plane of the quartz crystal XT1 mounted on the rotating stage, which is similar to the step S120.

Subsequently, the quartz crystal XT1 on the rotating stage is cut along the Y"-axis and Z'-axis, as is the case for step S130. Here, multiple quartz crystals XT2 shaped tabularly are cut out from the quartz crystal XT1.

Subsequently, multiple quartz plates 110 are formed in a single quartz crystal XT2, for example, by etching, and driving electrodes and others are formed thereon. An aggregate board of multiple quartz vibration elements 102 is thereby obtained. Here, the quartz plates 110 may be formed by etching to have, for example, a mesa or reverse-mesa shape or a convex or bevel shape. The aggregate board is separated into individual quartz vibration elements 102. The method of forming multiple quartz plates 110 in the quartz crystal XT2 is not limited to the etching but may be, for example, mechanical cutting. The method of shaping each quartz plate 110 is not limited to the etching but may be, for example, chemodynamic polishing. The shaping of each quartz plate 110 may be performed before the step of forming electrodes such as the driving electrodes or may be performed after this step.

As described above, in the quartz vibration element 102 according to the embodiment of the present disclosure, the quartz plate satisfies both $\psi=\alpha\times\varphi\times\theta$ and $-0.0165-0.016 \leq \alpha \leq -0.0165+0.016$ or $+0.0165-0.016 \leq \alpha \leq 0.0165+0.016$ when the X'-axis and the Y'-axis of the quartz crystal are obtained by rotating the X-axis and the Y-axis about the Z-axis by the rotation angle φ and when the Y"-axis and a Z'-axis of the quartz crystal are obtained by rotating the Y'-axis and the Z-axis about the X'-axis by the rotation angle θ, and when the angle ψ is an angle between the X-axis and a long side of the quartz plate when the principal surfaces 112 and 114 of the quartz plate 110 are viewed in plan.

With this configuration, the quartz vibration element 102 with a low ESR and a small frequency shift by temperature is provided.

In the above quartz vibration element, when the rotation angle φ for counterclockwise rotation as viewed from the positive side along the Z-axis is assumed to be positive, the quartz plate may satisfy 1°≤φ≤14°.

With this configuration, the frequency shift in a high-temperature zone can be reduced. In addition, a reduction in the electromechanical coupling coefficient k can be suppressed, and the ESR also can be reduced due to the secondary vibration being suppressed.

In the above quartz vibration element, when the rotation angle θ for counterclockwise rotation as viewed from the positive side along the X'-axis is assumed to be positive, the quartz plate 110 may satisfy 30°≤θ≤40°.

With this configuration, the frequency shift can be reduced in low- and high-temperature zone.

In the quartz vibration element, each one of the principal surfaces 112 and 114 of the quartz plate 110 is shaped like a rectangle having sides parallel to the X'-axis and the other sides parallel to the Z'-axis.

With this configuration, the size of the quartz plate 110 can be maximized by efficiently utilizing the internal space 101 of the quartz vibrator 100. This leads to a reduction in the ESR.

According to another aspect of the present disclosure, the method of manufacturing the quartz vibration element 102 of the embodiment includes a step of determining the Y'-axis and the Z'-axis of the quartz crystal XT0, a step of cutting the quartz crystal XT0 along the XY' plane and the Z'X plane, a step of determining the X'-axis and the Y"-axis of the quartz crystal XT1, and a step of cutting the quartz crystal XT1 along the Z'X' plane and the Y"Z' plane.

With this configuration, the quartz vibration element 102 that has favorable frequency-temperature characteristics and that can suppress the occurrence of secondary vibrations can be provided. In addition, it is not necessary to incline the quartz crystal during the measurement using the crystal orientation measurement system or during the cutting using the crystal cutter. Accordingly, the quartz vibration element 102 can be manufactured more conveniently and the angle error of the quartz plate 110 can be reduced compared with a known manufacturing method in which the quartz crystal needs to be inclined while the crystal orientations is measured and the quartz crystal is cut.

In the quartz vibration element according to the embodiment of the present disclosure, the internal space 101 may be sealed using a metal. In other words, the base member and the cover member are joined by a metallic bonding member. In this case, the connection electrodes of the base member are spaced from the sealing member, and the connection electrodes of the base member and the outer electrodes are electrically coupled using via electrodes that penetrates the base member.

The following summarizes a part of or an entirety of the embodiment of the present disclosure as a supplementary note. Note that the present disclosure is not limited to the supplementary note below.

According to an aspect of the present disclosure, a quartz vibration element includes: a quartz plate having a first principal surface and a second principal surface facing oppositely to each other; a first driving electrode on the first principal surface of the quartz plate; and a second driving electrode on the second principal surface of the quartz plate. When an X-axis, a Y-axis, and a Z-axis are defined as crystallographic axes of a quartz crystal of the quartz plate and an X'-axis and a Y'-axis of the quartz crystal are obtained by rotating the X-axis and the Y-axis about the Z-axis by a rotation angle φ and when a Y"-axis and a Z'-axis of the quartz crystal are obtained by rotating the Y'-axis and the Z-axis about the X'-axis by a rotation angle θ, the first principal surface and the second principal surface of the quartz plate are perpendicular to the Y"-axis. When one of the first principal surface or the second principal surface of the quartz plate is viewed in plan and an angle ψ is an angle between the X-axis and a long side of the quartz plate, the quartz plate satisfies both $\psi = \alpha \times \varphi \times \theta$ and $-0.0165 - 0.016 \leq \alpha \leq -0.0165 + 0.016$ or $+0.0165 - 0.016 \leq \alpha \leq +0.0165 + 0.016$.

In the above quartz vibration element, when the rotation angle φ for counterclockwise rotation as viewed from a positive side along the Z-axis is assumed to be positive, the quartz plate may satisfy 1°≤φ≤14°.

In the above quartz vibration element, when the rotation angle θ for counterclockwise rotation as viewed from a positive side along the X'-axis is assumed to be positive, the quartz plate may satisfy 30°≤θ≤40°.

In the above quartz vibration element, wherein each of the first principal surface and the second principal surface of the quartz plate has a rectangular shape having a first set of sides parallel to the X'-axis and a second set of sides parallel to the Z'-axis.

In the above quartz vibration element, the quartz plate may be constructed so as to vibrate in a thickness-shear vibration mode as a dominant vibration mode.

A quartz vibrator is provided. The quartz vibrator includes the quartz vibration element having any one of the above configurations, a base member, and a cover member joined to the base member. The quartz vibration element is inside an internal space defined by the base member and the cover member.

According to another aspect of the present disclosure, a method of manufacturing a quartz vibration element is provided. The method includes: preparing a quartz crystal having an X-axis, a Y-axis, and a Z-axis as crystallographic axes thereof; determining an X'-axis and a Y'-axis of the quartz crystal by rotating the X-axis and the Y-axis about the Z-axis by a rotation angle φ; cutting the quartz crystal along a plane perpendicular to the X'-axis; determining a Y"-axis and a Z'-axis of the quartz crystal by rotating the Y'-axis and the Z-axis about the X'-axis by a rotation angle θ; and cutting the quartz crystal along a plane perpendicular to the Y"-axis to obtain a quartz plate having a first principal surface and a second principal surface that are perpendicular to the Y"-axis and face opposite to each other. In addition, when one of the first principal surface or the second principal surface of the quartz plate is viewed in plan and an angle ψ is an angle between the X-axis and a long side of the quartz plate, the quartz plate satisfies both $\psi = \alpha \times \varphi \times \theta$ and $-0.0165 - 0.016 \leq \alpha \leq -0.0165 + 0.016$ or $+0.0165 - 0.016 \leq \alpha \leq +0.0165 + 0.016$.

In the above method of manufacturing the quartz vibration element, when the rotation angle φ for counterclockwise rotation as viewed from a positive side along the Z-axis is assumed to be positive, the quartz plate may satisfy $1°≤φ≤14°$.

In the above method of manufacturing the quartz vibration element, when the rotation angle θ for counterclockwise rotation as viewed from a positive side along the X'-axis is assumed to be positive, the quartz plate may satisfy $30°≤θ≤40°$.

The above method of manufacturing the quartz vibration element may include cutting the quartz crystal along a plane perpendicular to the Z'-axis, and each of the first principal surface and the second principal surface of the quartz plate may have a rectangular shape having a first set of sides parallel to the X'-axis and a second set of sides parallel to the Z'-axis.

As described above, according to an aspect of the present disclosure, a quartz vibration element with a lower ESR and a small frequency shift by temperature can be provided, and a simplified method of manufacturing the quartz vibration element also can be provided.

Note that the embodiment described above is intended to facilitate understanding of the present disclosure and is not intended to limit the scope of the disclosure. The present disclosure can be altered or modified without departing from the spirit thereof, and the present disclosure includes equivalents thereof. In other words, a design change made by those skilled in the art on the basis of the embodiment and/or variations thereof falls within the scope of the present disclosure insofar as such a design change incorporates features of the present disclosure. For example, the arrangement, material, condition, shape, size, or the like, of each element included in the embodiment and/or the variations are not limited to what has been described by way of example and can be changed appropriately. In addition, the embodiment and the variations are examples. Configurations described in the embodiment and/or the variations can be replaced or combined with one another, and the replacement or combination is deemed to be included in the present disclosure insofar as the replacement or combination includes features of the present disclosure.

REFERENCE SIGNS LIST 100 quartz vibrator
101 internal space
102 quartz vibration element
110 quartz plate
112 upper surface
114 lower surface
120 first driving electrode
130 second driving electrode
122 first extended electrode
132 second extended electrode
124 first connection electrode
134 second connection electrode
150 base member
140 cover member
190 bonding member
φ rotation angle about Z-axis
θ rotation angle about X'-axis
ψ angle between X-axis and a long side of the quartz plate as principal surface of quartz plate is viewed in plan

The invention claimed is:

1. A quartz vibration element comprising:
a quartz plate having a first principal surface and a second principal surface facing oppositely to each other;
a first driving electrode on the first principal surface of the quartz plate; and
a second driving electrode on the second principal surface of the quartz plate, wherein
when an X-axis, a Y-axis, and a Z-axis are defined as crystallographic axes of a quartz crystal of the quartz plate, an X'-axis and a Y'-axis of the quartz crystal are obtained by rotating the X-axis and the Y-axis about the Z-axis by a rotation angle φ, and a Y"-axis and a Z'-axis of the quartz crystal are obtained by rotating the Y'-axis and the Z-axis about the X'-axis by a rotation angle θ, the first principal surface and the second principal surface of the quartz plate are perpendicular to the Y"-axis, and
when one of the first principal surface or the second principal surface of the quartz plate is viewed in plan and an angle ψ is an angle between the X-axis and a long side of the quartz plate, the quartz plate satisfies both $ψ=α×φ×θ$ and $-0.0165-0.016≤α≤-0.0165+0.016$ or $+0.0165-0.016≤α≤+0.0165+0.016$.

2. The quartz vibration element according to claim 1, wherein when the rotation angle φ for counterclockwise rotation as viewed from a positive side along the Z-axis is assumed to be positive, the quartz plate satisfies $1°≤φ≤14°$.

3. The quartz vibration element according to claim 2, wherein when the rotation angle θ for counterclockwise rotation as viewed from a positive side along the X'-axis is assumed to be positive, the quartz plate satisfies $30°≤θ≤40°$.

4. The quartz vibration element according to claim 1, wherein when the rotation angle θ for counterclockwise rotation as viewed from a positive side along the X'-axis is assumed to be positive, the quartz plate satisfies $30°≤θ≤40°$.

5. The quartz vibration element according to claim 1, wherein each of the first principal surface and the second principal surface of the quartz plate has a rectangular shape having a first set of sides parallel to the X'-axis and a second set of sides parallel to the Z'-axis.

6. The quartz vibration element according to claim 1, wherein the quartz plate is constructed so as to vibrate in a thickness-shear vibration mode as a dominant vibration mode.

7. A quartz vibrator comprising:
The quartz vibration element according to claim 1;
a base member; and
a cover member joined to the base member, wherein
the quartz vibration element is inside an internal space defined by the base member and the cover member.

8. The quartz vibrator according to claim 7, wherein when the rotation angle φ for counterclockwise rotation as viewed from a positive side along the Z-axis is assumed to be positive, the quartz plate satisfies $1°≤φ≤14°$.

9. The quartz vibrator according to claim 8, wherein when the rotation angle θ for counterclockwise rotation as viewed from a positive side along the X'-axis is assumed to be positive, the quartz plate satisfies $30°≤θ≤40°$.

10. The quartz vibrator according to claim 7, wherein when the rotation angle θ for counterclockwise rotation as viewed from a positive side along the X'-axis is assumed to be positive, the quartz plate satisfies $30°≤θ≤40°$.

11. The quartz vibrator according to claim 7, wherein each of the first principal surface and the second principal surface of the quartz plate has a rectangular shape a first set of sides parallel to the X'-axis and a second set of sides parallel to the Z'-axis.

12. The quartz vibrator according to claim 7, wherein the quartz plate is constructed so as to vibrate in a thickness-shear vibration mode as a dominant vibration mode.

13. A method of manufacturing a quartz vibration element, the method comprising:
preparing a quartz crystal having an X-axis, a Y-axis, and a Z-axis as crystallographic axes thereof;
determining an X'-axis and a Y'-axis of the quartz crystal by rotating the X-axis and the Y-axis about the Z-axis by a rotation angle $\varphi$;
cutting the quartz crystal along a plane perpendicular to the X'-axis;
determining a Y"-axis and a Z'-axis of the quartz crystal by rotating the Y'-axis and the Z-axis about the X'-axis by a rotation angle $\theta$; and
cutting the quartz crystal along a plane perpendicular to the Y"-axis to obtain a quartz plate having a first principal surface and a second principal surface that are perpendicular to the Y"-axis and face opposite to each other, and
when one of the first principal surface or the second principal surface of the quartz plate is viewed in plan and an angle $\psi$ is an angle between the X-axis and a long side of the quartz plate, the quartz plate satisfies both $\psi=\alpha\times\varphi\times\theta$ and $-0.0165-0.016\leq\alpha\leq-0.0165+0.016$ or $+0.0165-0.016\leq\alpha\leq+0.0165+0.016$.

14. The method of manufacturing the quartz vibration element according to claim 13, wherein when the rotation angle $\varphi$ for counterclockwise rotation as viewed from a positive side along the Z-axis is assumed to be positive, the quartz plate satisfies $1°\leq\varphi\leq14°$.

15. The method of manufacturing the quartz vibration element according to claim 14, wherein when the rotation angle $\theta$ for counterclockwise rotation as viewed from a positive side along the X'-axis is assumed to be positive, the quartz plate satisfies $30°\leq\theta\leq40°$.

16. The method of manufacturing the quartz vibration element according to claim 13, wherein when the rotation angle $\theta$ for counterclockwise rotation as viewed from a positive side along the X'-axis is assumed to be positive, the quartz plate satisfies $30°\leq\theta\leq40°$.

17. The method of manufacturing the quartz vibration element according to claim 13, further comprising:
cutting the quartz crystal along a plane perpendicular to the Z'-axis, wherein
each of the first principal surface and the second principal surface of the quartz plate has a rectangular shape having a first set of sides parallel to the X'-axis and a second set of sides parallel to the Z'-axis.

18. The method of manufacturing the quartz vibration element according to claim 13, further comprising:
forming a first driving electrode on the first principal surface of the quartz plate; and
forming a second driving electrode the second principal surface of the quartz plate.

* * * * *